(12) United States Patent
Dannenberg et al.

(10) Patent No.: US 11,608,264 B2
(45) Date of Patent: Mar. 21, 2023

(54) METHOD FOR MANUFACTURING A SUBSTRATE HAVING A REGION MECHANICALLY DECOUPLED FROM A SUPPORT, METHOD FOR MANUFACTURING AT LEAST ONE SPRING, AND A SUBSTRATE

(71) Applicant: Robert Bosch GmbH, Stuttgart (DE)

(72) Inventors: Arne Dannenberg, Metzingen (DE); Mike Schwarz, Kusterdingen (DE); Thomas Friedrich, Moessingen-Oeschingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 871 days.

(21) Appl. No.: 16/477,279

(22) PCT Filed: Dec. 15, 2017

(86) PCT No.: PCT/EP2017/083113
§ 371 (c)(1),
(2) Date: Jul. 12, 2019

(87) PCT Pub. No.: WO2018/130374
PCT Pub. Date: Jul. 19, 2018

(65) Prior Publication Data
US 2021/0130168 A1 May 6, 2021

(30) Foreign Application Priority Data
Jan. 16, 2017 (DE) .......................... 102017200587.4

(51) Int. Cl.
*B81C 1/00* (2006.01)
*B81B 7/02* (2006.01)

(52) U.S. Cl.
CPC ............ *B81C 1/00531* (2013.01); *B81B 7/02* (2013.01); *B81B 2201/0264* (2013.01);
(Continued)

(58) Field of Classification Search
CPC ........ B81C 1/00531; B81C 2201/0132; B81C 2201/0133; B81B 7/02; B81B 2201/0264;
(Continued)

(56) References Cited

U.S. PATENT DOCUMENTS 6,271,052 B1 8/2001 Miller et al.
8,792,153 B2 * 7/2014 Reinmuth .......... G02B 26/0841
359/290

(Continued)

FOREIGN PATENT DOCUMENTS

CN 105565256 A 5/2016
TW 201546473 A 12/2015

OTHER PUBLICATIONS

International Search Report for PCT/EP2017/083113, dated Apr. 10, 2018.

*Primary Examiner* — Jiong-Ping Lu
(74) *Attorney, Agent, or Firm* — Norton Rose Fulbright US LLP; Gerard Messina

(57) ABSTRACT

A method for manufacturing a substrate including a region, which is mechanically decoupled from a support and has at least one component situated on the region; at least one recess being introduced on a front side of the substrate; an etching pattern being prepared on a back side of the substrate and etched anisotropically in such a manner, that vertical channels are produced on the back side of the substrate; and subsequently, a cavity being introduced at the back side of the substrate; the at least one recess on the front side of the substrate being connected to the cavity on the back side of the substrate; and in at least one region between the front
(Continued)

side of the substrate and the cavity, at least two recesses or at least two segments of a recess being interconnected by at least one channel.

11 Claims, 2 Drawing Sheets

(52) U.S. Cl.
CPC ............... *B81B 2203/0127* (2013.01); *B81B 2203/0163* (2013.01); *B81C 2201/0132* (2013.01)

(58) Field of Classification Search
CPC .... B81B 2203/0127; B81B 2203/0163; B81B 2203/019; B81B 7/0016
USPC .................................. 216/2, 11, 40, 79, 97
See application file for complete search history.

(56) References Cited

U.S. PATENT DOCUMENTS

| | | | |
|---|---|---|---|
| 9,463,976 B2* | 10/2016 | Steimle | B81C 1/00238 |
| 2007/0246665 A1 | 10/2007 | LaFond et al. | |
| 2013/0044363 A1 | 2/2013 | Reinmuth | |
| 2015/0037597 A1* | 2/2015 | Kim | B81C 1/00492 |
| | | | 428/448 |
| 2015/0122038 A1 | 5/2015 | Mayer et al. | |
| 2015/0375995 A1 | 12/2015 | Steimle et al. | |
| 2017/0120242 A1* | 5/2017 | Rivas | G01N 29/222 |

* cited by examiner

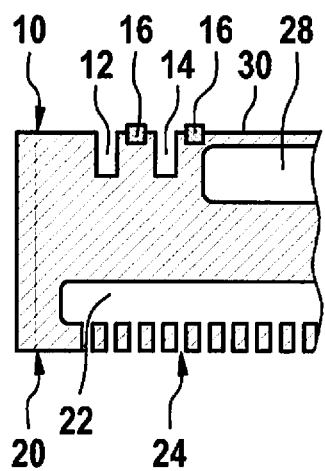 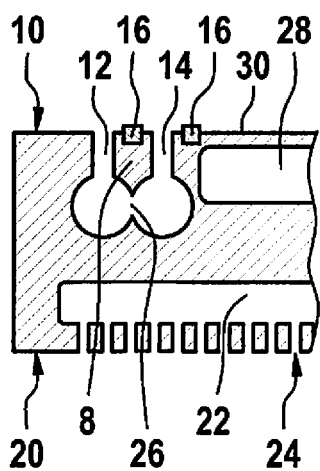 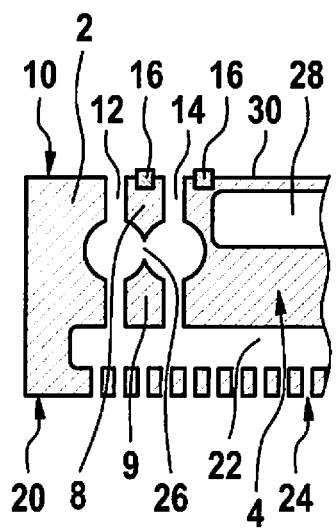
FIG. 2a  FIG. 2b  FIG. 2c
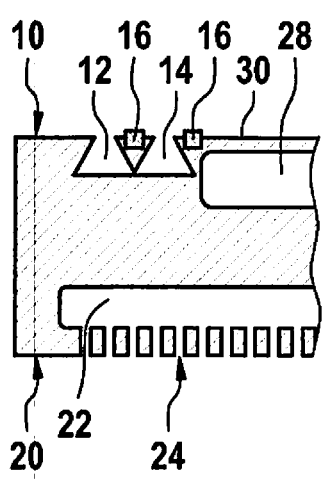 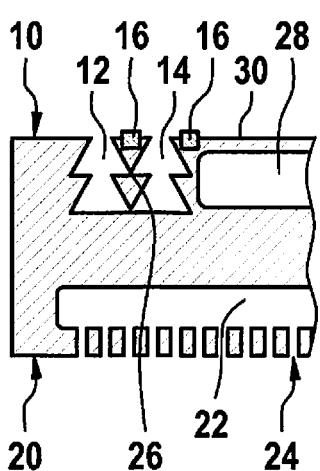 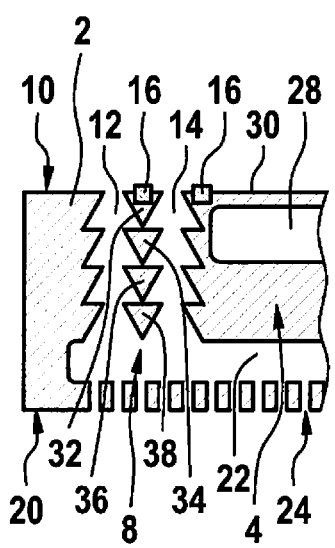
FIG. 3a  FIG. 3b  FIG. 3c

METHOD FOR MANUFACTURING A SUBSTRATE HAVING A REGION MECHANICALLY DECOUPLED FROM A SUPPORT, METHOD FOR MANUFACTURING AT LEAST ONE SPRING, AND A SUBSTRATE

FIELD

The present invention relates to a method for manufacturing a substrate having a region mechanically decoupled from a support, a method for manufacturing at least one spring, as well as a substrate having a mechanically decoupled region.

BACKGROUND INFORMATION

The semiconductor components, which are used as electromechanical transducers in micromechanical pressure sensors, absorb not only the mechanical stress, which is produced directly by pressure acting upon the diaphragm, but also the stress due to interfering mechanical influences from the environment. Such interfering influences may be produced by the deformation of a circuit board or substrate, on which the pressure sensor is mounted, or by the thermal characteristic of different materials and surface layers of the pressure sensor and/or of the substrate.

Conventional pressure sensors include those in which pressure sensor diaphragms are released on all sides. In this context, one or more trenches or recesses are introduced on the front side of a substrate, around the pressure sensor. The ridges between the trenches are later released by introducing a cavity at a back side of the substrate, and form springs for absorbing mechanical forces.

SUMMARY

An object of the present invention is to provide a substrate, which includes a region that is mechanically decoupled from another region of the substrate, that is, from a support. A further object of the present invention is to reduce the stiffness of such a mechanical decoupling.

This object may be achieved with the aid of the present invention. Advantageous refinements of the present invention are described herein.

According to one aspect of the present invention, an example method is provided for manufacturing a substrate including a region, which is mechanically decoupled from a support and has at least one component situated on the region; at least one recess being introduced on a front side of the substrate, and an etching pattern being prepared on a back side of the substrate and etched anisotropically in such a manner, that vertical channels are produced on the back side of the substrate. A cavity is subsequently produced at the back side of the substrate, using isotropic etching; the at least one recess on the front side of the substrate being connected to the cavity on the back side of the substrate. In at least one region between the front side of the substrate and the cavity on the back side of the substrate, at least two recesses situated side-by-side or at least two segments of a recess are interconnected horizontally by at least one channel, so that at least one spring situated between the at least two recesses or the at least two segments of a recess is produced; the spring being subdivided along its horizontal extension, by the at least one channel, into at least two spring sections. In this case, a horizontal plane of extension corresponds to a surface of the substrate or runs parallelly to it. A vertical extension corresponds to an extension perpendicular to the surface of the substrate.

By introducing recesses or trenches into the front side of the substrate, around a region on which a component is situated, ridges are produced between the recesses. Alternatively, ridges may be produced, using a single recess; the recess being able to run, for example, in a circular or angularly spiral-shaped manner, and including, at least regionally, at least one adjacent segment of the individual recess in at least one section. The adjacent segments may form a ridge, as well. These ridges are released by forming a cavity from the back side of the substrate. This forms springs, which act as bar springs. The springs connect the region to be decoupled from the other region of the substrate, that is, from a support. Consequently, the springs may decouple mechanical forces between the decoupled region and the support. In this case, the springs have a vertical extension, which corresponds to the distance between an upper surface of the front side of the substrate and the cavity at the back side of the substrate. Depending on their shape and extension, the springs have a stiffness, which is a function of direction. The stiffness of a beam spring in a vertical direction is proportional to the cube of its vertical extension. By subdividing a spring having a vertical extension of, for example, 10 μm into two spring sections, which are positioned one on top of the other and each have a vertical extension of 5 μm, the stiffness of the two spring sections in the vertical direction may be reduced to one quarter. In the case of subdivision into three spring sections, which are positioned vertically one on top of the other, which each have a vertical extension of 3.33 μm, the stiffness in the vertical direction may be reduced by a factor of 9. In this case, the stiffness in the horizontal direction does not change. In at least one region between the front side of the substrate and the cavity, the at least two recesses or at least two segments of a recess are interconnected by at least one channel. In this connection, the channel connects the at least two recesses or at least two segments of a recess along their entire horizontal extension or only partially along the horizontal extension. Through this, a spring having a certain vertical extension becomes at least two spring sections, which are positioned one on top of the other and are separated from each other by the channel. By this measure, the stiffness of the springs in the vertical direction may be reduced, which means that the region, that is, the component, to be decoupled may be mechanically decoupled from the support, that is, from the rest of the substrate, in an improved manner. In this connection, the one spring may also be a plurality of springs, which are advantageously situated on or around the region to be decoupled. In this case, the substrate may be a wafer, a motherboard, a circuit board, a p.c. card and the like, made of silicon or another doped or undoped semiconductor or non-conductor.

According to one exemplary embodiment of the method, the support and the mechanically decoupled region are interconnected by at least one spring. The springs connect the region to be decoupled from another region of the substrate, that is, from a support. Thus, the springs may absorb deformations of the support via their deflection and reduce the mechanical forces on the decoupled region markedly.

In a further exemplary embodiment of the method, the at least one recess is introduced into the front side of the substrate, using anisotropic material removal to at least a first depth. In this case, the anisotropic material removal may be a milling operation or a directional etching process, which may be plasma-enhanced. Thus, the first depth may determine a vertical extension of a first spring section of the spring. This may allow the stiffness of the first spring section to be determined.

According to a further exemplary embodiment of the method, prior to the isotropic material removal, regions in the recesses are protected from material removal by passivation. This allows the isotropic material removal to be carried out in a plurality of steps without attacking the protected regions, which means that greater depths and, therefore, larger spring sections may be produced. In addition, the passivation allows for the geometric design of the channels.

In a further exemplary embodiment of the method, the at least two recesses or the at least two segments of a recess may alternately be interconnected by channels introduced with the aid of isotropic material removal, and separated from each other by regions not removed. Through this, a plurality of spring sections may be produced. As already described above, the stiffness of the spring may be reduced by an increasing number of spring sections. In this case, the spring may be made up of a number of spring sections, which are positioned one above the other in the vertical direction and each have a spacing with respect to each other that corresponds to a channel. This allows, in particular, the mechanical decoupling of the component to be improved.

According to a further exemplary embodiment of the method, the at least one channel is produced by at least two instances of anisotropic material removal including widening of sidewalls. Instead of anisotropic material removal with a resulting, nearly perpendicular, vertical profile and, consequently, perpendicular walls, the material removal may also be carried out with, e.g., conical widening of sidewalls of the recesses, in the direction of the back side of the substrate. Consequently, the widening of the sidewalls may produce a horizontal connection, which subdivides the spring. For example, an anisotropic etching step may be used, which has a lateral etching rate greater than a vertical etching rate. This may be achieved, for example, with the aid of a KOH (potassium hydroxide) etching process and a suitable crystal orientation of the substrate, or by deep, dry-chemical etching (DRIE); the passivating/etching cycle times being adapted for such widening. This operation may also be carried out in multiple parts, until a vertical through-connection between the front side of the substrate and the channel at the back side of the substrate is formed. In this operation, the spring is preferably subdivided into a plurality of spring sections along its horizontal extension.

According to a further exemplary embodiment of the method, the isotropic material removal is accomplished by an etching process. Through this, the isotropic material removal may be, for example, a chemical etching process, which dissolves and removes a material of the substrate nondirectionally and uniformly.

In a further exemplary embodiment of the method, the anisotropic etching is carried out, using deep ion etching. In this manner, for example, a deep reactive ion etching (DRIE) process may be used for introducing recesses.

In one further exemplary embodiment of the method, the etching pattern is deposited photolithographically. This allows particularly simple masks to be deposited on the substrate for a further etching process. Consequently, a plurality of etching operations may also be carried out simultaneously.

According to a further aspect of the present invention, a method is provided for producing at least one spring, using at least one recess in a substrate, in order to mechanically decouple a region from a support of the substrate. In this case, in a first step, the at least one recess is introduced by anisotropic removal of material to a first depth. In at least one second step, at least one channel is introduced into the substrate, up to a second depth, by removing material isotropically at the level of the first depth, and two different recesses or at least two segments of at least one single recess are interconnected by the at least one channel. In at least one third step, the at least one recess is extended by removing material anisotropically to a third depth. In this manner, in a first step, the at least one recess having a specific depth is introduced into the substrate. In a second step, the recesses or the at least two segments of a recess are interconnected, so that a first spring section of the at least one spring is released for decoupling a region from a support. In a third step, the anisotropic material removal is continued, so that the at least one recess produces a connection to the cavity at a back side of the substrate or to the back side of the substrate. This allows a spring having two spring sections to be manufactured, using simple technical devices.

According to one exemplary embodiment of the method for manufacturing at least one spring, the at least one second step and the at least one third step are repeated alternately, until the at least two recesses or at least two segments of a recess are connected by a cavity at the back side of the substrate, or by the back side of the substrate. The described steps may also be repeated several times. In this connection, the depth obtainable by the specific material removal may be controlled and/or set in such a manner, that a plurality of spring sections are formed, until the recesses produce a connection between the front side of the substrate and a cavity at the back side of the substrate or the back side of the substrate.

According to a further aspect of the present invention, a substrate having a support and a region mechanically decoupled from the support is provided, which may be manufactured according to a method as shown in an above-mentioned aspect of the present invention; the mechanically decoupled region including at least one component mounted on it, and the mechanically decoupled region including at least one recess, which runs around at least a part of the decoupled region and defines at least one spring; the at least one spring being subdivided by at least one channel running parallelly to the spring, into at least two spring sections, which run parallelly to each other and are positioned vertically one on top of the other. In this manner, the substrate includes a region, which is decoupled by the spring from the remaining part of the substrate, that is, from the support. By dividing the spring up vertically into a plurality of spring sections, a stiffness of the spring in the vertical direction may be improved, and consequently, optimized mechanical decoupling of the region to be decoupled, from the support, may be rendered possible. In this connection, the region to be decoupled may include one or more components. The region to be decoupled preferably includes a pressure sensor having a diaphragm, which is connected directly to piezoelectric elements and, in response to a pressure increase or pressure decrease, mechanically excites them in such a manner, that a pressure-dependent voltage may be measured at the piezoelectric elements and evaluated. Alternatively, a temperature sensor may also be positioned as a component on the region to be decoupled, since temperature fluctuations may also produce marked thermal expansion and, therefore, loading of a region adjacent to the temperature sensor. Alternatively, or in addition, besides a component, a temperature sensor may be situated on the region to be decoupled, in order to be able to determine the temperature on the decoupled region exactly. Due to the mechanical decoupling, the decoupled region is also thermally decoupled.

In one exemplary embodiment of the substrate, an electrical conductor, which connects the mechanically decoupled region electrically to the support, is situated on the at least one spring between at least two recesses or at least two segments of a recess. Through this, the component or components on the region to be decoupled may be supplied with electrical energy, and relevant parameters, such as piezoelectric voltages or thermoelectric voltages, may be measured. For example, the spring may include one or more electrical lines on the front side of the substrate and/or electrical lines on the back side of the substrate, as well, which may lead to the decoupled region or lead away from it.

According to a further exemplary embodiment of the substrate, the at least one spring includes at least one coil, which is situated between the support and the mechanically decoupled region. In this manner, the spring may be constructed in the shape of a spiral and be folded multiple times. This measure allows, in particular, a horizontal stiffness of the spring to be reduced and decoupling in the horizontal direction to be optimized.

According to a further exemplary embodiment of the substrate, the mechanically decoupled region is connected to the support by at least one spring. Through this, the region to be decoupled may be connected to the support by at least one spring, and mechanical forces between the two regions may be compensated for.

Below, preferred exemplary embodiments of the present invention are explained in greater detail in light of highly simplified, schematic representations.

BRIEF DESCRIPTION OF THE DRAWINGS

FIG. 2 shows a schematic cross section A-A from FIG. 1; in addition, the figure shows a method for manufacturing a spring according to a first exemplary embodiment.

FIG. 3 shows a schematic cross section A-A from FIG. 1; in addition, the figure elucidates a method for manufacturing a spring according to a second exemplary embodiment.

DETAILED DESCRIPTION OF EXAMPLE EMBODIMENTS

Figure 1:
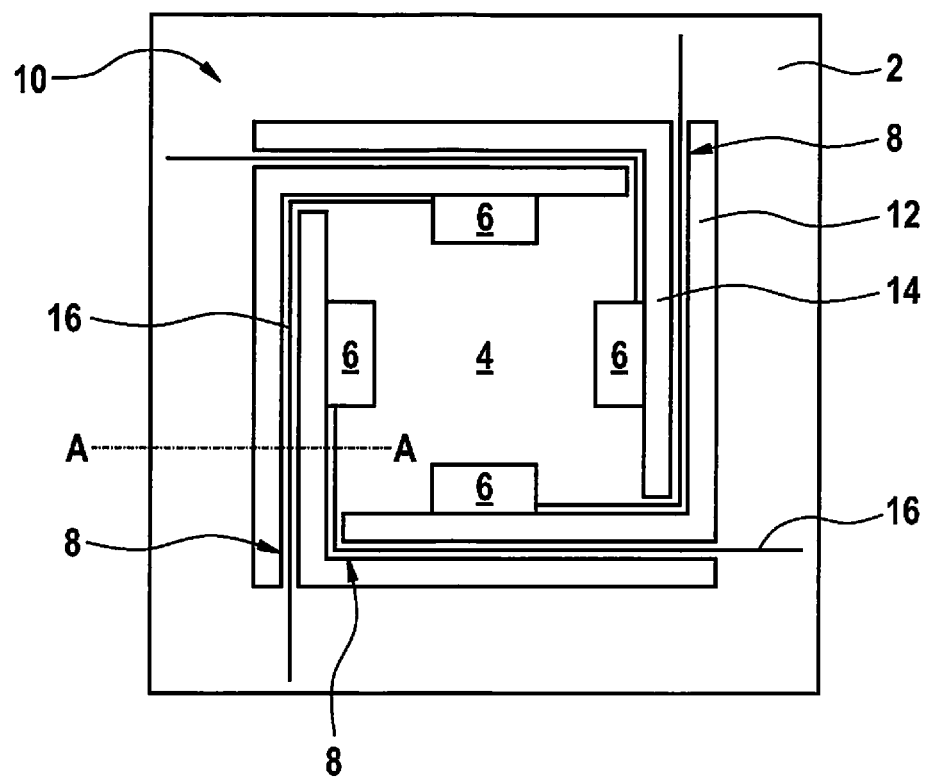
FIG. 1 shows a schematic plan view of a substrate according to a first exemplary embodiment.

In the figures, identical structural elements have, in each instance, the same reference numerals.

FIG. 1 shows an exemplary embodiment of a substrate 1 according to a first exemplary embodiment. Substrate 1 includes a support 2. Support 2 forms a region of substrate 1, which is situated around a mechanically decoupled region 4. Components 6 are situated on mechanically decoupled region 4; according to the exemplary embodiment, these being piezoelectric elements 6, which may record a deformation of decoupled region 4 and generate a voltage, which is a function of a deformation of decoupled region 4. Support 2 and decoupled region 4 are set apart from each other by springs 8. Springs 8 do connect decoupled region 4 to support 2, but may compensate for and/or absorb mechanical forces. Therefore, springs 8 prevent transmission of mechanical forces and/or mechanical stress. Springs 8 are formed by recesses 12, 14 situated on both sides. Recesses 12, 14 join a front side 10 of substrate 1 visible in FIG. 1 to a back side 20 of substrate 1 not visible. Recesses 12, 14 are L-shaped, so that a recess 12, 14 forms, in each instance, a side of two springs 8. In this manner, four springs may be formed by four L-shaped recesses 12, 14. Alternatively, two or more separate recesses 12, 14 may also be used for forming a spring 8. On front side 10 of substrate 1, electrical lines 16 are situated on springs 8. According to the exemplary embodiment, electrical lines 16 are made of copper, but may be made of any conductive material or alloy, such as aluminum, silver, tin, graphite and the like. In this case, electrical lines 16 connect, in each instance, a piezoelectric element 6 to evaluation electronics, which are not shown and are situated on support 2.

A schematic cross section A-A from FIG. 1 is shown in FIG. 2. In this connection, using method steps in FIGS. 2a-2c, FIG. 2 elucidates a method for manufacturing a spring 8 in a substrate 1 according to a first exemplary embodiment. According to the exemplary embodiment, substrate 1 has a cavity 22, which has been etched, using a corresponding etching pattern 24 at back side 20 of substrate 1. In FIGS. 2a and 2b, springs 8, 9 have not yet been formed, since recesses 12, 14 do not connect front side 10 to back side 20 of substrate 1. In a first step, anisotropic etchings are carried out up to a first depth, so that a first depth section of recesses 12, 14 is formed to have a horizontal, trench-shaped extension. In a second step, which is represented in FIG. 2b, an isotropic etching operation is carried out up to a second depth. In this isotropic etching operation, a channel 26 is formed, which interconnects the two recesses 12, 14 along their horizontal extension. A first spring section 8 of springs 8, 9 is formed by recesses 12, 14 and channel 26. In a third step, which is represented in FIG. 2c, channel 26 is extended by further anisotropic etching, until recesses 12, 14 interconnect front side 10 of substrate 1 and cavity 22 at back side 20 of substrate 1. Thus, a second spring section 9 of springs 8, 9 is formed by recesses 12, 14, cavity 22 and channel 26. Thus, springs 8, 9 include two spring sections 8, 9, which run parallelly along their horizontal extension and have a stiffness reduced in comparison with a comparable one-piece spring. Both spring sections 8, 9 connect support 2 to region 4 to be decoupled. According to the exemplary embodiment, region 4 to be decoupled also includes a cavity 28, which forms a diaphragm 30 on region 4 to be decoupled. Applying pressure or negative pressure to diaphragm 30 allows diaphragm 30 to deform and consequently act mechanically upon the piezoelectric elements 6 shown in FIG. 1.

A schematic cross section A-A from FIG. 1 is shown in FIG. 3. In this connection, using method steps in FIGS. 3a-3c, FIG. 3 elucidates a method for manufacturing a spring 8 in a substrate 1 according to a second exemplary embodiment. In contrast to the method according to the first exemplary embodiment, the method according to the second exemplary embodiment includes, in its steps, only anisotropic material removal, which produces widening of sidewalls. In this manner, in an etching operation in the direction of back side 20 of substrate 1, the etching channel is widened conically. Through this, the widening of sidewalls may be adapted to a spacing of adjacent recesses 12, 14 in such a manner, that the etching channels connect at a first depth. A first spring section 32 of spring 8 is formed by this step. This anisotropic etching operation may now be continued in steps, until, for example, recesses 12, 14 produce a connection between front side 10 and back side 20 of substrate 1. A spring section 32, 34, 36, 38 is preferably formed in each etching operation or etching step. Using this method, a spring 8 having a plurality of spring sections 32, 34, 36, 38 may be produced. If necessary, a passivation layer, which is used as an etching mask, may be deposited onto substrate 1, that is, into recesses 12, 14 and their sidewalls, prior to each etching operation.

What is claimed is:

1. A method for manufacturing a substrate having a region, which is decoupled mechanically from a support and has at least one component situated on the region, the method comprising:
   introducing at least one recess on a front side of the substrate;
   producing an etching pattern on a back side of the substrate;
   producing vertical channels on the back side of the substrate by etching the etching pattern anisotropically; and
   producing a cavity in the substrate by etching the etching pattern at the back side of the substrate isotropically;
   wherein the at least one recess on the front side of the substrate is connected to the cavity on the back side of the substrate, and at least two recesses or at least two segments of a recess are interconnected in at least one region between the front side of the substrate and the cavity, by at least one channel, so that at least one spring situated between the at least two recesses or between the at least two segments of a recess is produced, the at least one spring being subdivided into at least two spring sections by the at least one channel in accordance with its vertical extension.

2. The method as recited in claim 1, wherein the support and the mechanically decoupled region are interconnected by at least one spring.

3. The method as recited in claim 1, wherein the at least one recess is introduced into the front side of the substrate, by removing material anisotropically to at least one first depth.

4. The method as recited in claim 3, wherein prior to the material removal, regions in the recess are protected from material removal by passivation.

5. The method as recited in claim 3, wherein the material removal is accomplished by an etching process.

6. The method as recited in claim 1, wherein the at least two recesses or the at least two segments of a recess are alternately interconnected by channels introduced by isotropic material removal and separated from each other by non-removed regions.

7. The method as recited in claim 1, wherein the at least one channel is produced, using at least two instances of anisotropic material removal that include widening of sidewalls.

8. The method as recited in claim 1, wherein the anisotropic etching is accomplished, using deep ion etching.

9. The method as recited in claim 1, wherein the etching pattern is deposited photolithographically.

10. A method for manufacturing at least one spring, using at least one recess in a substrate, to decouple a region mechanically from a support of the substrate, the method comprising:
    in a first step, introducing the at least one recess by anisotropically removing material to a first depth;
    in at least one second step, introducing at least one channel into the substrate, up to a second depth, by removing material isotropically at a level of the first depth, and at least two recesses or at least two segments of a recess are interconnected by the at least one channel so that at least one spring situated between the at least two recesses or between the at least two segments of a recess is produced, the at least one spring being subdivided into at least two spring sections by the at least one channel in accordance with its vertical extension; and
    in at least one third step, extending the at least one recess to a third depth by removing material anisotropically.

11. The method for manufacturing at least one recess as recited in claim 10, wherein the at least one second step and the at least one third step are repeated alternately, until the at least one recess is connected to the cavity of the back side of the substrate, or connected to the back side of the substrate.

* * * * *